United States Patent [19]
Lippmann et al.

[11] Patent Number: 5,665,897
[45] Date of Patent: Sep. 9, 1997

[54] METHOD OF CALIBRATING AND ZEROING STEPPER MOTOR GAUGES

[75] Inventors: Raymond Lippmann, Ann Arbor; Gail Monica Sylvester, Frankenmuth; Ronald Kenneth Selby, Burton; James Edward Nelson, North Branch; Michael John Schnars, Clarkston, all of Mich.

[73] Assignee: Delco Electronics Corporation, Kokomo, Ind.

[21] Appl. No.: 695,045

[22] Filed: Aug. 9, 1996

[51] Int. Cl.[6] .................................................. G01D 18/00
[52] U.S. Cl. ..................................... 73/1.01; 318/490
[58] Field of Search ............................... 73/1 R; 318/490

[56] References Cited

U.S. PATENT DOCUMENTS

| | | | |
|---|---|---|---|
| 3,823,265 | 7/1974 | Ludwig et al. | 178/34 |
| 3,896,363 | 7/1975 | Kinsel et al. | 318/490 X |
| 4,315,328 | 2/1982 | Schwab | 368/66 |
| 4,330,739 | 5/1982 | Chiang | 318/490 X |
| 4,487,065 | 12/1984 | Carlin et al. | 73/290 V |
| 4,535,405 | 8/1985 | Hill et al. | 318/490 X |
| 5,247,655 | 9/1993 | Khan et al. | 395/433 |

*Primary Examiner*—Thomas P. Noland
*Attorney, Agent, or Firm*—Jimmy L. Funke

[57] ABSTRACT

A rotary gauge driven by a stepper motor has a stop near the zero point of the gauge graphics. A factory calibration procedure rotates the gauge field in reverse direction to move the gauge pointer against the stop and continues field rotation until the rotor becomes unstable and flips back in the forward direction, and then moved to a rotor rest position. The angle of flip back, the rest position and the number of steps to the zero position are stored in non-volatile memory. In the vehicle, when the ignition is off, the microprocessor or the stepper motor wakes periodically and exercises the gauge, using the stored values to reset the gauge to the stable position. When ignition is turned on, the microprocessor moves the gauge directly to the zero position.

15 Claims, 2 Drawing Sheets

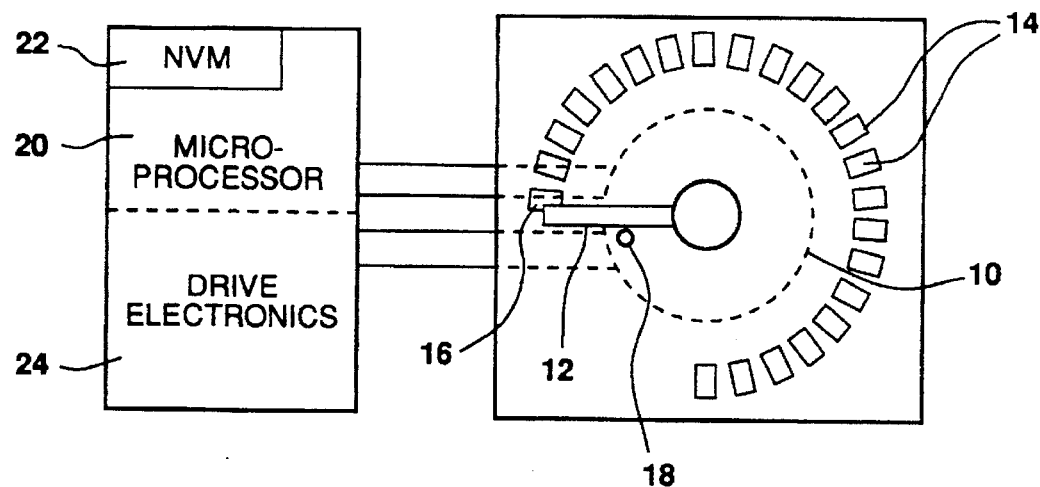
FIG - 1
PRIOR ART
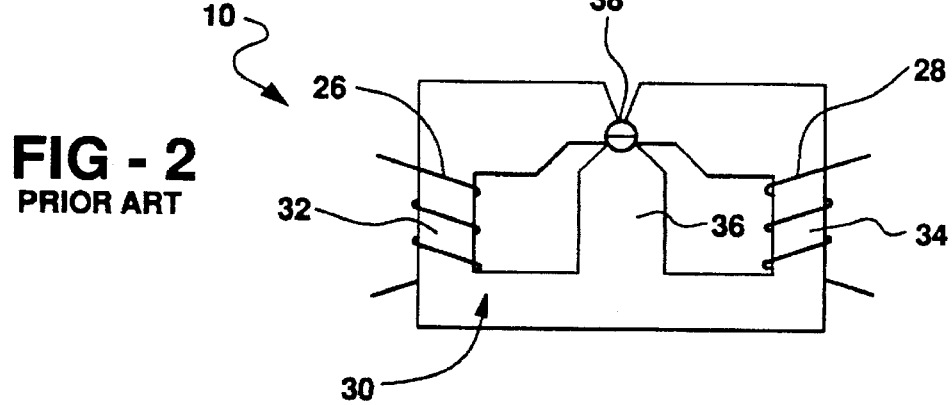
FIG - 2
PRIOR ART
FIG - 3
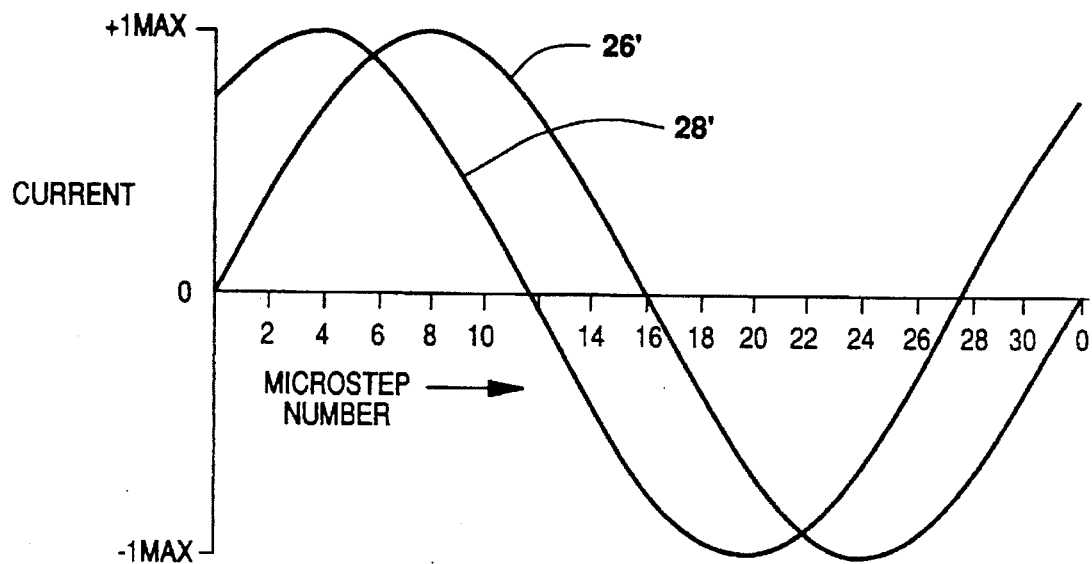

METHOD OF CALIBRATING AND ZEROING STEPPER MOTOR GAUGES

FIELD OF THE INVENTION

This invention relates to stepper motor gauges and particularly to a method of selecting a rest position and positioning the gauges at the rest position.

BACKGROUND OF THE INVENTION

Stepper motor gauges are being used increasingly in vehicle displays instead of traditional air core gauges because they exhibit improved accuracy, linearity, lower power consumption and they are in some respects easier to drive from a microprocessor. FIG. 1 shows a typical stepper motor application which includes a motor 10 driving a pointer 12 around a dial having graphical indicia 14. A zero indicia 16 at one end of the dial marks the beginning point of gauge measurement such as 0 MPH or Empty fuel level. The pointer is shown in a rest or home position at or near the zero position and a mechanical stop 18 (on the dial or elsewhere in the mechanism) prevents pointer excursion more than a slight amount below the rest position. A microprocessor 20 including a non-volatile memory (NVM) 22 and associated drive circuits 24 is coupled to two drive coils 26 and 28 of the motor 10, shown in FIG. 2.

The stepper motor described herein is a two pole motor but it should be understood that the invention is equally applicable to motors having a larger number of pole sets. The stepper motor 10 has a magnetically soft iron core 30 having first and second legs 32 and 34 wound with drive coils 26 and 28, respectively, and a common center leg 36. The three legs meet at a rotor 38 to supply a rotating electrical field to the rotor. The rotor 38 in this case is a two pole permanent magnet which rotates to align with the electrical field vector. The rotor is coupled to the pointer 12 through a gear train, not shown. The two motor coils 26 and 28 are energized by drive currents 26' and 28' controlled by the drive electronics in the manner shown in FIG. 3. By controlling the magnitude and sequencing of the drive current waveforms, the rotor 38 can be made to rotate either in a forward (clockwise in this case) or reverse direction. The two waveforms are varied in a stepped pseudo-sinusoidal manner and the waveforms are separated by 60° of phase. Discrete current levels are output onto the two coils for each of 32 steps which comprise 360° of field rotation (for a two pole motor), as well as rotor movement if the rotor movement is not obstructed by the stop 18. Other numbers of steps, e.g. 24, could be used. The steps are controlled by a counter which is incremented or decremented at a controlled rate, depending on the desired direction and speed of rotation. The counter overflows or underflows every 32 steps and the sequence is repeated. Most stepper motor mechanisms use a gear train to reduce the angular motion of the rotor to allow for precise positional placement of the pointer and to enhance the fluid appearance of the pointer motion. The gain on the gear train is often in the range from 20:1 to 180:1. Where the gear train has a gear ratio of 180:1, 360° of rotor rotation or 32 steps thus correspond to 2° of pointer movement.

In some stepper motors, the geometry of the motor core provides two natural stable or detent points for the two pole rotor. These points are important when considering the behavior of the motor when the cluster is powered down. When power is removed from the motor, the rotor assumes a position at the closest one of the two detent points and is used as a rest point. Other stepper motors are designed to minimize the stable detent effect, and when power is removed from the motor the rotor remains stationary due to friction. In this case, any point may be selected as a rest point.

When a gauge is driven in reverse against the stop 18 and the drive current continues to rotate the field, the gauge will be biased against the stop until the field rotates more than 180° beyond the stop (for a two pole motor). Then the rotor becomes unstable and moves 180° in the forward direction or "flips back" to align with the field. This is shown in FIG. 4. Thus as the counter number decrements (starting at the right) the rotor moves toward the stop location, and when it reaches the stop it remains stationary for 16 counts and then flips back 180° of the rotor or 1° of the pointer. This cycle is repeated as long as the counter continues to decrement.

Gauges used in vehicle instrument clusters must often be accurate within a fraction of a degree of pointer rotation. Stepper motor gauges are usually operated in an open loop which makes it essential that the zero position is accurately known at all times during normal operation. A fixed number of steps forward from the starting position corresponds to the pointer display angle and any errors which might occur in counting the steps cause a display error which accumulates indefinitely during the life of the vehicle unless some measures are taken to calibrate the mechanism from time to time. There are a number of potential sources of stepping errors including vehicle transients, abnormally high accelerations which might be encountered during vehicle accidents or severe bumps, and movement of the pointer during instrument cluster assembly. One of the advantages of using the stepper motors is that precisely balanced pointers are not required and therefore accelerations encountered by them can cause them to exert torque on the mechanism.

A traditional way of assuring the pointer starts at the rest position upon vehicle start up is to rotate the motor field several degrees in reverse to move the pointer against the stop to correct for any position errors that have occurred. If the driving circuit detects that the battery voltage had been disconnected since the last power-down, then the field is rotated for a considerable angle to accommodate the possibility that the pointer had been left stranded far from the stop. Because of the flip back phenomenon, the pointer may flutter through several cycles. The flutter causes an objectionable acoustic noise to be generated. Moreover, the flip back causes an uncertainty of up to 1° in the position of the pointer.

Another way of addressing the zeroing problem is to use circuits to detect the flip back event and then to stop the motion against the stop. When the rotor flips back a small current is induced in the coils and can be used to detect the flip back. The exact electrical angle at which flip back occurs is measured during the assembly of the cluster and is stored in the microprocessor non-volatile memory. During start-up, the pointer is driven in the direction of the stop until flip back is detected and then the pointer is advanced a small amount to the graphics zero position which is at least ½ rotor revolution forward of the stop. Two problems result from this method. First, the flip back detection circuit may cause increased cost of the gauge by adding extra elements and even by requiring an expensive IC integration process. Second, the pointer moves slightly below the normal operating area on the gauge graphics during power-up. This excursion below zero may cause the driver to misinterpret the lowest location of gauge movement which can be a significant perceptual error, for example on a fuel gauge.

SUMMARY OF THE INVENTION

It is therefore an object of the invention to establish the rest position of a stepper motor gauge without testing for the stop position upon vehicle start-up. Another object is to ensure that the gauge is at rest position and to directly move the gauge to zero position upon start-up. Another object is to accomplish the zeroing of a stepper motor gauge without flip back detection upon start-up.

The improved method of zeroing a stepper motor gauge consists of a two step process. First, factory calibration is performed at cluster assembly time to learn and store the flip angle, the stable detent position (rest position) or an assigned rest position, and the distance from the rest position to the graphics zero position. The second part is performed periodically when the vehicle is not operating and presumably unoccupied. It entails waking the microprocessor on a timed basis to position the gauge at the known rest position using the stored data. If the gauge is for some reason not at the rest position, it will be moved closer to the rest position each time the second part is executed. As with previous methods, if the driver circuitry determines that the battery has been disconnected since the previous power-down, the gauge field will be rotated back a substantial distance to ensure that the gauge reaches the stop. Upon vehicle start-up, the gauge is moved directly from the rest position to the zero position.

BRIEF DESCRIPTION OF THE DRAWINGS

The above and other advantages of the invention will become more apparent from the following description taken in conjunction with the accompanying drawings wherein like references refer to like parts and wherein:

FIG. 1 is a schematic view of a prior art stepper motor gauge assembly;

FIG. 2 is a view of a stepper motor used in the assembly of FIG. 1;

FIG. 3 is a waveform diagram illustrating the electrical drive currents for the gauge of FIG. 1;

DESCRIPTION OF THE INVENTION

Figure 4:
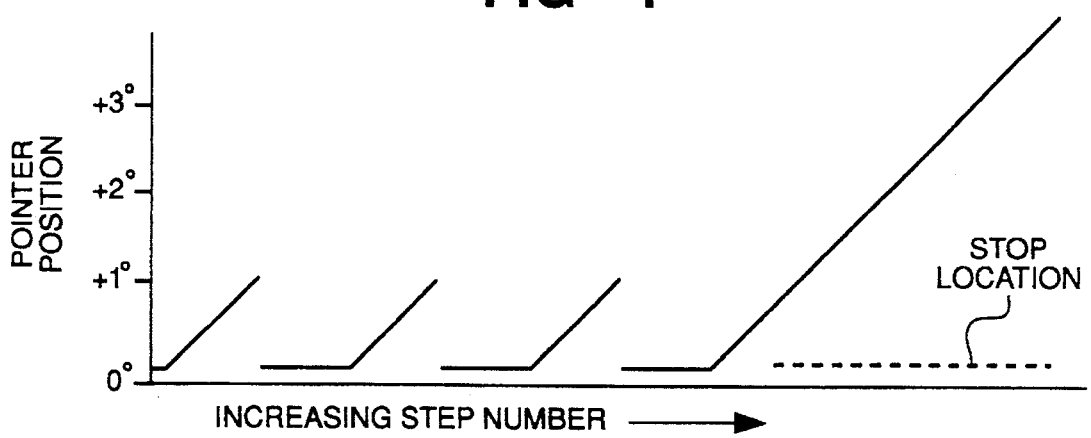
FIG. 4 is a graphical illustration of stepper motor flip back operation.

The improved gauge operation is carried out on the gauge 10 as described above with respect to FIGS. 1–4. The same gauge assembly hardware is used, only the software is enhanced and factory calibration is changed to load specific gauge data into the memory 22 of the microprocessor 20.

Calibration is performed at the time of instrument cluster assembly on each stepper motor gauge in the cluster. The objective of the calibration is to learn or establish the flip back rotor angle, the stable detent position or rest position, and the graphic zero position. The calibration includes the following steps:

1. The motor driver is commanded to step in the reverse direction to drive the gauge pointer to the stop and to step the field beyond the stop position.
2. After the stop is contacted, continuing reverse rotation is commanded until flip back just occurs.
3. The flip back is detected and the counter step where flip back occurs is stored in NVM.
4. The stop position in the rotor cycle is determined from the flip back step by the equation: stop=flip back step−16 steps. If the motor is of the stable detent type, the stable detent position nearest the stop (or the detent position nearest the stop in the forward direction) is computed and stored in NVM as the rest position. If the motor lacks significant detent action, a rest point is assigned to the motor. The rest point may be arbitrarily chosen or it may be set equal to some value related to the stop position such as the flip back count.
5. The motor is stepped to align the pointer with the graphics zero position. The number of steps from the rest position to the zero position is stored in NVM.
6. The rotor is then returned to the rest position and power is removed.

In step 2, the flip back can be detected with a machine vision system or electrically with test equipment. When using a vision system, the pointer position is monitored as the field is stepped below the pointer stop. Flip back manifests itself as an abrupt 1° motion of the pointer above the pointer stop. Alternatively, voltage or current measurements can be made on the motor coils. The motion of the rotor generates a magnetic flux change in the core of the motor which can be observed as a change in motor coil current or voltage.

In step 4, because stable detent positions occur every 180° of rotor rotation for the stable detent type of motor, the closest stable detent position to the stop will always be within 90° (8 steps) of the stop. For negative rest angles the rotor is actually loaded against the stop and will be quite stable, although a smaller impulse is required to dislodge the rotor than with positive rest angles. Allowing only positive rest position angles will result in greater stability, but the rest position of the rotor can be as much as 180° (16 steps) above the stop.

During operation in a vehicle, a repeatable stable rest position can be achieved and the pointer can be easily positioned to the graphics zero position by using the data stored during the calibration procedure. In order to counter the errors which might cause missing steps to accumulate, the motor must be commanded to seek the rest position from time to time. The use of the stored data allows this to be accomplished by correction cycles which take place when the vehicle is not in operation. This is carried out by a commonly used microprocessor utility which maintains the microprocessor in a sleep mode when the vehicle ignition is off but periodically wakes up the microprocessor to perform a task. For example, the wake up may occur each hour to execute a correction cycle.

The correction cycle typically comprises the following steps:

1. When a desired time interval has elapsed with power off, say one hour, the microprocessor is powered up.
2. The motor driver is then powered up as close as possible to the rest position as stored in the NVM. This operation generally will not disturb the motor position much because it will have been previously left in this stable detent position.
3. Reverse rotation of the motor is then commanded to drive the motor field until the flip angle stored in the NVM is attained. To guarantee that flip back will occur, the reverse rotation should exceed the flip angle by a small amount, say a couple of steps.
4. The motor is then commanded to the rest position.
5. The motor drive circuit and the microprocessor are then powered down.

This procedure results in a negative field rotation of one cycle or 360° starting and ending at the rest angle. In the normal case where the gauge starts the cycle in the correct position, the field will move the gauge to the stop and subsequently the rotor will flip back 180° from the stop and then move to the rest position. However when some anomaly causes the gauge to be forward of the rest position by one or more rotor rotations, the gauge will not reach the stop and will not flip back; then the gauge will be moved toward the stop and end at the rest position or at least closer to the rest position by one rotor rotation. Then more than one correction cycle may be required to finally reach the home position.

Figure 5:
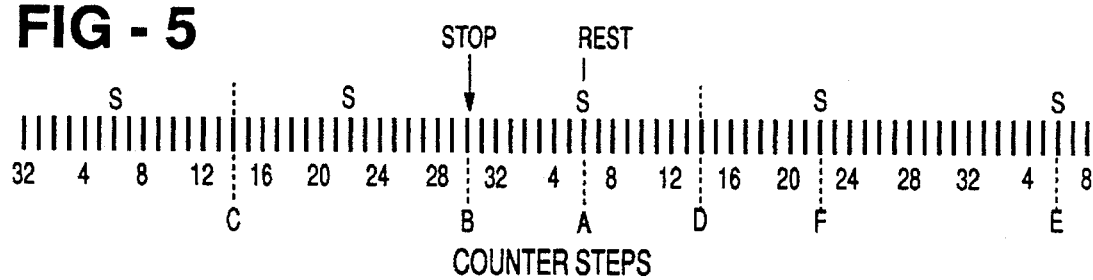
FIG. 5 is a diagram illustrating a correction procedure according to the invention.

The correction cycle is illustrated by the FIG. 5 diagram. The series of marks represent counter steps which go from 1 to 32 and then repeat. For stable detent motor types, the stable positions at steps 6 and 22 are marked by an S. A stop position has been selected at count 30. Assuming the gauge is at the rest position A, the correction cycle will move the pointer to the stop at B and the field will continue to rotate 180° to C at step 14 or 1 or 2 steps below that point where flip back occurs to move the pointer forward 180° to D at step 14 (or 1 or 2 steps below D) in the higher count series. Continued field rotation to the rest position 6 returns the pointer to position A.

On the other hand, if the initial pointer position were at position E, 360° above the rest position, the correction cycle would simply move the pointer to the rest position A. In the case where the initial pointer position were at the position F, 180° above the rest position, the rotor would become unstable at F when the field was initiated at position A. As the field moved in the reverse direction to about step 4 below position A, the rotor would flip back to align with the field at step 4 just below position E, and would then be moved to position A as the field continued its programmed rotation.

Figure 6:
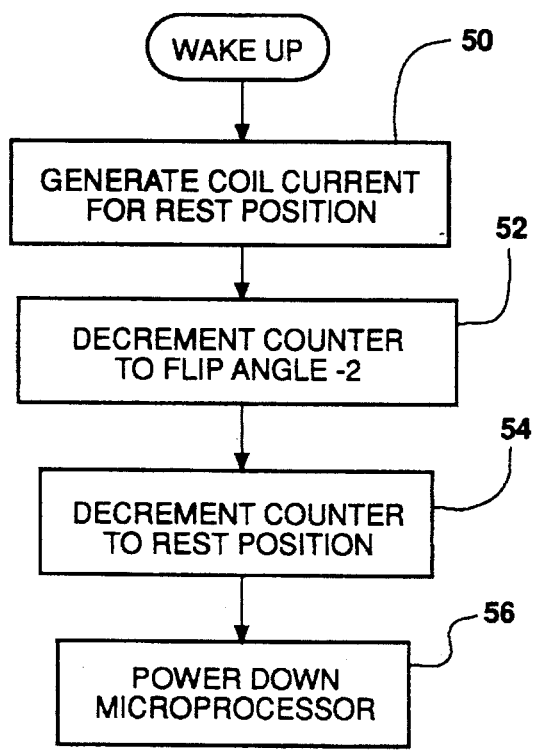
FIGS. 6 and 7 are flow charts representing programs for carrying out the correction method according to the invention.

To accomplish the correction cycle the microprocessor is programmed in accordance with the flow chart of FIG. 6 wherein the functional description of each block in the chart is accompanied by a number in angle brackets <nn> which corresponds to the reference number of the block. The counter step values of the flip angle and the selected rest position have been stored in non-volatile memory at calibration. When the microprocessor wakes up, it first sets the counter to the rest position angle to establish the field at rest position <50> and then decrements the counter to rotate the field in reverse to just beyond the flip angle <52>. Then counter is decremented further to continue the field rotation in the same direction to return to the rest position <54>. Finally the microprocessor powers down <56>.

Figure 7:
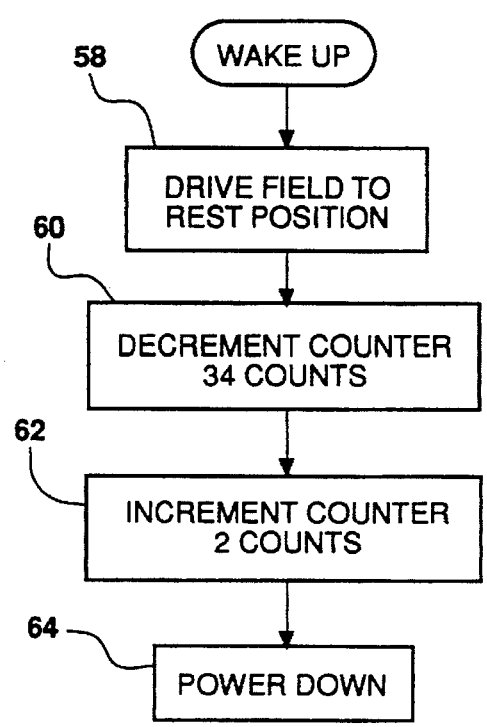

A variant of the correction cycle does not require the flip angle to be stored in NVM. Upon wake up, the microprocessor and its driving circuit establish the field at the rest position, then decrements the counter by 34 counts and powers down. Thus if the gauge is at rest position it will be moved to the stop and the field will rotate two steps beyond the flip angle, causing the gauge to flip back to two steps beyond the rest position. When the field current is removed the rotor moves forward to the stable rest position for a stable detent motor; otherwise the counter is incremented two steps to return to the rest position. The reason for rotating the field a little more than 360° is to accommodate the case where the initial position of the rotor is at a position 180° from the stop, and it is desirable to rotate the field just enough to ensure flip back. This method is shown in FIG. 7. After wakeup, the field is driven to the rest position <58> and rotated through the stop position by decrementing the counter by 34 counts <60>, then incrementing two counts <62> to return to rest position, and then powering down the microprocessor <64>.

For a motor without stable detent positions the variant of the correction cycle is not as accurate. If the flip angle is not measured during the calibration cycle, there can be some ambiguity whether moving the rotor to the selected rest position will bias the gauge against the stop or move the gauge above the stop. Thus the starting position at the time of vehicle start-up is uncertain. However, the size of the error may be acceptable for some applications. This method has the advantage that the calibration process is shortened and less data has to be stored.

When the vehicle ignition is turned on, the microprocessor simply establishes the field at the rest position and commands rotation of the motor a sufficient amount to reach the zero position, based on the value stored in non-volatile memory for this purpose. This value may be more than one motor rotation from rest position, although usually it is desirable to select a rest position near the graphics zero position. When the ignition is turned off, the microprocessor remains awake long enough to move the gauge to the rest position, and then it enters the sleep mode.

In the case of a fuel gauge it is desirable that the pointer rest very near the empty indicia so that the driver does not suppose that a pointer position below the mark represents the actual empty condition. During calibration, if the stop is not near the empty indicia, the rest position is selected to be a position near the empty mark. If the rest position is in the positive direction from the flip angle, the number of steps from the flip back position must be recorded in the NVM. Then the correction step requires that the field must rotate more than one complete reverse rotation to pass the flip back condition, and then must be driven forward by the recorded number of steps to reach the rest position. For example, if in FIG. 5 the rest position were chosen to be at position E, which is 32 steps above the position A, the field would be rotated in reverse two rotations to move the rotor to the stop and then flip back to position D and back to A, and then moved forward 32 steps to position E.

It will thus be seen that the two step correction method of calibration during assembly and running correction cycles when the vehicle ignition is turned off ensures that the gauge is at a designated rest position when the ignition is turned on so that the gauge moves directly to the zero position. Annoying pointer flutter and noise do not occur when ignition is turned on, but rather such activity takes place periodically when the ignition is off and the vehicle is likely to be unoccupied. Moreover, special circuitry to detect flip back is not required thereby minimizing the cost of the gauge.

The embodiments of the invention in which an exclusive property or privilege is claimed are defined as follows:

We claim:

1. A method of securing a rest position of a vehicle gauge driven by a stepper motor having a rotating field controlled by a motor driver including a microprocessor wherein the gauge has a stop, and wherein when the field is rotated beyond the stop the motor is subject to reaching an unstable angle and flipping back a fixed angle from the stop, comprising the steps of:

calibrating the gauge to establish a rest position near the stop;

when vehicle ignition is turned off, setting the gauge at the rest position and powering down the microprocessor; and then when the vehicle is not in use, maintaining the rest position by powering up the microprocessor, energizing the motor driver to the rest position value, and rotating the motor field in reverse through a preset angle so that if the gauge actually was at the rest position the gauge reaches the stop, the field rotates through the unstable angle and flip back occurs, whereby the gauge is returned to the rest position.

2. The invention as defined in claim 1 wherein if the gauge was actually at a position higher than the rest position, the rotating step comprises rotating the motor in reverse a full turn to a position at or nearer to the rest position.

3. The invention as defined in claim 1 wherein the step of maintaining the rest position is repeated periodically when the vehicle is turned off.

4. The invention as defined in claim 1 wherein:
the calibrating step includes determining the angular distance from the rest position to a zero gauge position;
upon initiation of vehicle use, energizing the motor driver to the rest position value; and
rotating the gauge through the determined angular distance to the zero gauge position.

5. The invention as defined in claim 1 wherein:
the calibrating step includes measuring the angle of the unstable position; and
the rotating step comprises
rotating the motor field in reverse at least through the measured angle to ensure flip back if the gauge actually was at the rest position, and
continuing rotation of the motor field for a net 360° reverse rotation to attain the rest position.

6. The invention as defined in claim 1 wherein the gauge has a plurality of stable detent positions and wherein:
the calibrating step includes measuring the angle of the unstable position; and
if the gauge was actually at a stable detent position higher than the rest position, the rotating step comprises rotating the motor in reverse through the measured angle and continuing rotation of the motor for a net 360° reverse rotation to another stable detent position at or nearer to the rest position.

7. In a vehicle gauge driven by a microprocessor controlled stepper motor and having a stop limiting the gauge range, a method of establishing and maintaining a gauge rest position comprising the steps of:
establishing a rest position near the stop;
setting the gauge to the rest position and setting the microprocessor to a sleep mode each time vehicle ignition is turned off;
while the ignition is off, periodically resetting the gauge by waking the microprocessor and energizing the motor to move the gauge toward the stop and then to the rest position.

8. The invention as defined in claim 7 wherein the gauge includes graphics having a zero position, and the step of determining a rest position comprises:
locating the zero position of the gauge graphics; and
selecting a rest position at or near the zero position;
determining the distance of the rest position from the flip angle.

9. The invention as defined in claim 7 wherein the motor has a field controlled by the microprocessor and the step of determining a rest position comprises:
calibrating the gauge by rotating the motor field to move the gauge against the stop and continuing field rotation in the same direction until the motor flips back to a flip angle spaced from the stop, and arbitrarily setting the rest position.

10. The invention as defined in claim 7 wherein the motor has a field controlled by the microprocessor and the step of energizing the motor comprises:
when the microprocessor wakes and the gauge is at the rest position
rotating the field in reverse to move the gauge against the stop,
continuing the field rotation until the motor flips back to a flip angle spaced from the stop, and
further continuing the field rotation to restore the gauge to the rest position.

11. The invention as defined in claim 7 wherein the motor has a plurality of stable positions and the step of establishing a rest position comprises:
determining the stop position;
determining a rest position characterized by a stable motor position near the stop.

12. The invention as defined in claim 11 wherein the motor has a field controlled by the microprocessor and the step of energizing the motor comprises:
rotating the field in reverse a distance sufficient to move the gauge to the flip angle; and
then rotating the field by the determined distance to restore the gauge to the rest position;
whereby if the gauge is in the rest position when the microprocessor wakes, the gauge will flip back at the flip angle and the gauge will stop at the rest position, and if the gauge is in a stable detent position forward of the rest position the gauge will not flip back and will stop at or nearer to the rest position.

13. The invention as defined in claim 11 wherein the motor has a field controlled by the microprocessor and the step of determining a rest position comprises:
calibrating the gauge by rotating the motor field to move the gauge against the stop and continuing field rotation in the same direction until the motor flips back to a flip angle spaced from the stop, and setting the rest position as a stable motor position between the stop and the flip angle.

14. The invention as defined in claim 11 wherein the motor has a field controlled by the microprocessor and the step of energizing the motor comprises:
when the microprocessor wakes and the gauge is at a stable position forward of the rest position, rotating the field in reverse to move the gauge to another stable position nearer the stop.

15. The invention as defined in claim 11 wherein the motor has a field controlled by the microprocessor and including:
calibrating the gauge to establish a flip angle at which the gauge flips back in the forward direction when driven beyond the stop; and
the step of energizing the motor comprises rotating the field in the reverse direction through the flip angle to effect gauge flip back and then rotating the field further to a stable position, whereby the stable position will be the rest position if the gauge is within a single motor rotation of the rest position when the microprocessor wakes.

* * * * *